(12) United States Patent
Bobok et al.

(10) Patent No.: US 9,286,426 B2
(45) Date of Patent: Mar. 15, 2016

(54) METHOD AND APPARATUS FOR TESTING

(71) Applicant: International Business Machines Corporation, Armonk, NY (US)

(72) Inventors: Gabor Bobok, Haifa (IL); Shlomit Koyfman, Qiryat Yam (IL); Shiri Moran, Kiryat Tivon (IL); Ziv Nevo, Yokneam Ilit (IL); Gil Shurek, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 3 days.

(21) Appl. No.: 14/259,163

(22) Filed: Apr. 23, 2014

(65) Prior Publication Data

US 2015/0310154 A1 Oct. 29, 2015

(51) Int. Cl.
*G06F 17/50* (2006.01)

(52) U.S. Cl.
CPC ........ *G06F 17/5045* (2013.01); *G06F 17/5022* (2013.01)

(58) Field of Classification Search
CPC .................................................. G06F 17/5022
USPC ....................................................... 716/106
See application file for complete search history.

(56) References Cited

U.S. PATENT DOCUMENTS

| 6,453,450 | B1 | 9/2002 | Walter |
| 6,691,078 | B1 | 2/2004 | Beer et al. |
| 7,911,466 | B2 | 3/2011 | Iwashita |
| 8,307,313 | B2 | 11/2012 | Baumgartner et al. |
| 8,413,088 | B1 | 4/2013 | Armbruster et al. |
| 2002/0002698 | A1* | 1/2002 | Hekmatpour ...................... 716/4 |
| 2012/0311513 | A1 | 12/2012 | Kurshan et al. |
| 2013/0019216 | A1 | 1/2013 | Vasudevan et al. |

FOREIGN PATENT DOCUMENTS

JP 4153699 9/2008

OTHER PUBLICATIONS

Ranjan et al., "Beyond Verification: Leveraging Formal for Debugging", DAV09, 46th ACM/IEEE Design Automation Conference, Jul. 2009.
Wile B., "Designer-level verification using TIMEDIAG/GENRAND", IBM Journal of Research and Development, vol. 41, Issue 4.5, Jul. 1998' pp. 581-591.
Zhang et al., "Research on Hardware Design Verification Methods", Abstract, Advanced Material Research, vols. 588-589, Chapter 8, pp. 1208-1213, Nov. 2012. Can be found at : http://www.scientific.net/AMR.588-589.1208.
Lu et al, "Hardware Design, Simulation and Verification of AAC LC Decoder", Abstract, Audio Engineering, 2011. Can be found at :http://en.cnki.com.cn/Article_en/CJFDTOTAL-DSJS201102009.htm.

* cited by examiner

*Primary Examiner* — Thuan Do

(57) ABSTRACT

A computer-implemented method, apparatus and computer program product for testing a design, the method comprising receiving a design; receiving a description of a scenario, wherein the scenario relates to execution of the design, wherein the scenario is used for verifying the design; translating the scenario to an input for a verification engine, wherein the verification engine is selected from the group consisting of a simulation engine and a formal analysis engine; activating the engine and providing the input to the engine, whereby the engine outputting a result; and displaying the result.

18 Claims, 6 Drawing Sheets

METHOD AND APPARATUS FOR TESTING

TECHNICAL FIELD

The present disclosure relates to testing in general, and to a tool for designer level block testing at, in particular.

BACKGROUND

Computerized devices control almost every aspect of our life—from writing documents to controlling traffic lights. However, computerized systems are bug-prone, and thus require a testing phase in which the bugs should be discovered. The testing phase is considered one of the most difficult tasks in designing a computerized device. The cost of not discovering a bug may be enormous, as the consequences of the bug may be disastrous. For example, a bug may cause the injury of a person relying on the designated behavior of the computerized system. Additionally, a bug in hardware or firmware of a marketed product may be expensive to fix, as patching it requires call-back of the computerized device. Hence, many developers of computerized systems invest a substantial portion of the development cycle in discovering erroneous behaviors of the computerized device.

When designing hardware projects, designer-level verification (DLV) is increasingly gaining acceptance as a necessary practice. As manufacturing processes are fast approaching physical limits, providers of high-end hardware systems look for highly optimized micro-architectures and unique functional features to differentiate their products. This trend puts a significant load on the size and complexity of the functional content provided by both the chip and system levels, and as a result drives a dramatic surge in the number of functional defects. The price and burden of correcting the bugs increase as the defects are identified closer to the product release. Hence, functional verification is becoming a prime factor in the hardware development process.

A straightforward method for reducing the cost of bugs is early identification and correction, by the developer of a logic block, prior to integration with other blocks. Unexpected behavior identified in the designer's environment, before releasing the code to integration, is simpler to analyze, has no impact on the integrated verification process, can be corrected without contributing to the logical-physical closure "churn", and is therefore less likely to spawn new functional bugs. This is true for hardware as well as for software projects.

Designer-level verification for hardware projects is sometimes believed to not optimally utilize the designer's valuable expertise and time. However, discovering bugs at a later stage may require much more designer time as well as other resources, thus causing an enormous increase in the correction price.

Currently there are no efficient tools for hardware designers for testing their blocks prior to integration. Using verification-level tools requires specific knowledge of the complex tools and procedures, which may take a long time to master and use, since such tools are intended for use on large, integrated design units, and are therefore not adapted for the small component level of DLV.

BRIEF SUMMARY

One aspect of the disclosure relates to a computer-implemented method performed by a computerized device, comprising: receiving a design; receiving a description of a scenario, wherein the scenario relates to execution of the design, wherein the scenario is used for verifying the design; translating the scenario to an input for a verification engine, wherein the verification engine is selected from the group consisting of a simulation engine and a formal analysis engine; activating the engine and providing the input to the engine, whereby the engine outputting a result; and displaying the result.

Another aspect of the disclosure relates to a computerized apparatus having a processor, the processor being adapted to perform the steps of: receiving a design; receiving a description of a scenario, wherein the scenario relates to execution of the design, wherein the scenario is used for verifying the design; translating the scenario to an input for a verification engine, wherein the verification engine is selected from the group consisting of a simulation engine and a formal analysis engine; activating the engine and providing the input to the engine, whereby the engine outputting a result; and displaying the result.

Yet another aspect of the disclosure relates to a computer program product comprising a computer readable storage medium retaining program instructions, which program instructions when read by a processor, cause the processor to perform a method comprising: receiving a design; receiving a description of a scenario, wherein the scenario relates to execution of the design, wherein the scenario is used for verifying the design; translating the scenario to an input for a verification engine, wherein the verification engine is selected from the group consisting of a simulation engine and a formal analysis engine; activating the engine and providing the input to the engine, whereby the engine outputting a result; and displaying the result.

BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

DETAILED DESCRIPTION

Figure 1:
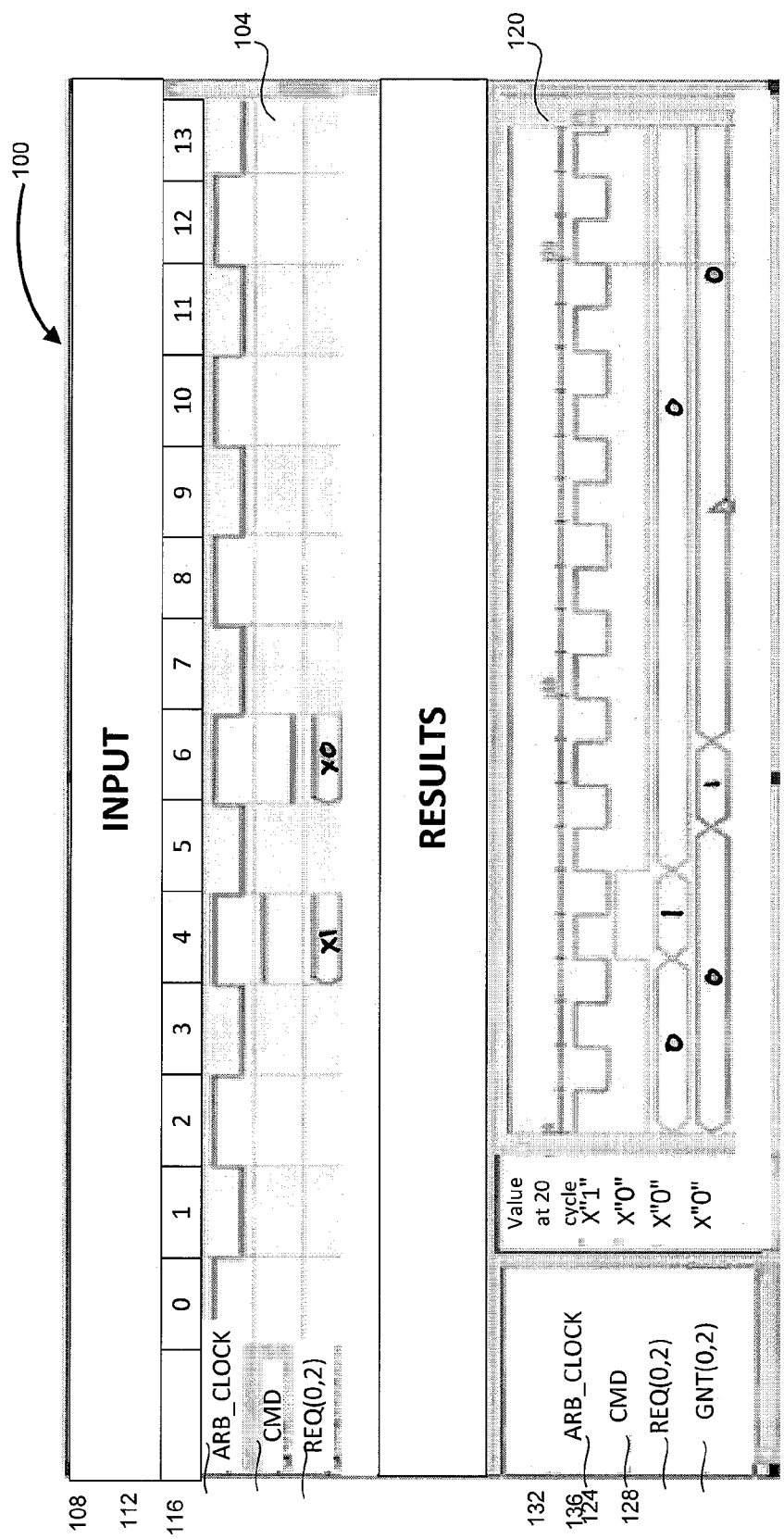
FIG. 1 shows an exemplary user interface of an apparatus for designer-level verification, in accordance with some exemplary embodiments of the disclosed subject matter.

The disclosed subject matter is described below with reference to flowchart illustrations and/or block diagrams of methods, apparatus (systems) and computer program products according to embodiments of the subject matter. It will be understood that blocks of the flowchart illustrations and/or block diagrams, and combinations of blocks in the flowchart illustrations and/or block diagrams, can be implemented by computer program instructions. These computer program instructions may be provided to one or more processors of a general purpose computer, special purpose computer, a tested processor, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a non-transient computer-readable medium that can direct a computer or other programmable data processing apparatus to function in a particular manner, such that the instructions stored in the non-transient computer-readable medium produce an article of manufacture including instruction means which implement the function/act specified in the flowchart and/or block diagram block or blocks.

The computer program instructions may also be loaded onto a device. A computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

One technical problem dealt with by the disclosed subject matter is the lack of an adequate system for designer-level verification which provides the designer with relatively powerful and convenient tools for logic block verification in an intuitive manner, such that the designer does not have to invest significant effort in familiarizing with the tools. The tools may assist in functional designer-level verification, which may include but is not limited to simulation of selected scenarios and validating the results on one hand, and formal analysis including formal verification or model checking, on the other hand. The tools may combine high speed and high capacity similarly to simulation tools, with the exhaustiveness of formal analysis on the other hand, within a relatively intuitive and easy to use system, such that the designer would benefit also from short-term projects.

Another technical problem dealt with by the disclosed subject matter is the need for designing and inputting waveforms in a graphical language for specifying input stimuli, constraints, coverage goals and correctness checkers.

Yet another technical problem relates to the need to automatically select an appropriate engine, possibly from a multiplicity of simulation engines or verification engines, in accordance with identification of the problem at hand.

Yet another technical problem relates to interpreting the scenario requirements such as the coverage goals, correctness checks and parameters from the input as provided by the user in a natural form to a format corresponding to the selected engine. In some exemplary embodiments, requirements defined for simulation engines may have to be interpreted to be used in formal analysis engines and vice versa.

One technical solution comprises an apparatus for verification in the block designer (also referred to as chip designer) level. The apparatus may provide the designer with tools for introducing scenarios for validating the design behavior under these scenarios, in order to expose design flaws, and provide a close look at corner cases. The apparatus may also enable the validation of in-code assertions and coverage points, and further debugging.

The apparatus may display a user interface container such as one or more windows. In one window or area, the designer may provide one or more waveforms or signals to be injected to the block under design. The user may further provide constraints, conditions to be checked or other scenarios.

The apparatus may then generate a test bench comprising one or more tests, based on the block description and the provided scenarios.

Engines, including any one or more simulation engines or formal analysis engines may then be used by the apparatus for testing the scenarios. The relevant engine or tool may be selected in accordance with the scenario to be checked. As an example, factors such as model size, the specified scenario using internal signals or output constraints, coverage goals, correctness checkers, or similar factors may be taken into account when automatically selecting an engine.

A simulation engine may receive a description of the block and input signals. The simulation engine may be configured to simulate execution of the block, and potentially direct the simulation, heuristically or otherwise, towards specific scenarios or states.

A formal analysis engine may receive a model of the block and a definition of a property or attribute (also referred to as a specification property). The formal analysis engine may be configured to verify that the model holds the property, provide a counter-example refuting the property, or the like. The property may be phrased in a temporal language, for example a property may be phrased as "three cycles after a first event a second event is expected". The property may be a safety property, such as an AGp property in which the property p is always to be held for each state of the model. Additionally or alternatively, the property may be a liveness property, such as EGp in which the property p is always eventually held.

A coverage goal may define an event, scenario or situation which may or may not be covered by the design. As an example, a coverage goal may be whether a queue can become full. Coverage goals may be checked using simulation engines such as by attempting to simulate an execution in which the coverage goal is covered. A simulation engine may check whether and how often a coverage goal is hit during simulation. Additionally or alternatively, coverage goals may be checked using formal analysis engines. A property which would be refuted if the mode reaches the coverage goal may be defined. In case the coverage goal is reachable, formal analysis would provide a counter-example of the property which would exemplify an execution which hits the coverage goal. The disclosed subject matter may allow seamless transition from simulation to formal analysis and vice versa when analyzing coverage goals.

An assertion may define a constraint that should be held. The assertion may be defined externally to the model or may be defined within the model itself. The assertion may or may not be defined using temporal logic. In some exemplary embodiments, a checker may relate to checking an assertion. The checker may be a Finite State Machine (FSM) whose state is modified based on the execution of the design and which may be configured to provide an indication when the design had hit an assertion, such as, for example, reached an invalid state.

The coverage goals or checkers may be indicated independently of the engine which may be used to check them. As an example, the user may define the coverage goal in a uniform manner which is independent of whether the coverage goal is checked using a simulation engine or a formal analysis engine. The coverage goals or checkers may be defined using one or more waveforms, or an equivalent textual manner, for example from a text file. In some exemplary embodiments, a corresponding parser may be used for generating waveforms from the textual representation.

Once the block design and scenarios are inputted, the apparatus can select the appropriate engine, translate the input to an appropriate format, launch the relevant engine and receive from the engine results comprising, for example, signals output by the designed block in response to the input scenarios. In some exemplary embodiments, a coverage goal to be used in a simulation engine may be translated into exploration goals to be used by formal analysis engines.

In another example, an expected result may be translated into a checker that may be used in formal analysis as well as in simulation tools. When executed by a simulation tool, the checker checks whether the property holds for a multiplicity of inputs. When executed by a formal analysis tool, the checker attempts to find a counter-example. Thus, a correctness checker that is used by a simulation engine, may be translated into correctness properties for formal analysis engines.

The apparatus may then display the output in another window or display area. The output may be displayed along or near the input, such that the user can review the output vis-à-vis the input. The user may introduce changes to the input and examine their effect on the output.

Thus, the designer may specify one or more scenarios, execute or verify them and analyze the results, all in a unified user interface and potentially in a uniform manner. Depending on the block design and the introduced signals which may include internal or output signals, the apparatus may select an appropriate engine and appropriate manner for outputting a result waveform.

The designer may provide additional information, such as internal signals or expected output signals. The expected output signals may then be displayed together or along with the output signal for comparison. Alternatively or additionally, a function of the expected output signal or the simulated output signal, such as a difference signal, may be displayed.

The apparatus may be integrated into the working environment of the designer which may provide compilers, simulation engines and wave viewers, such that the designer can use a single design environment throughout the development-verification-debugging cycle.

Another technical solution of the disclosure relates to a graphic way to define coverage goals and assertions. Waveforms may be used as a modeling language defining requirements. As an example, complex patterns such as clock, reset, one-hot, counters and others may be graphically defined using waveforms. The user interface may also provide for manipulation of the waveform provisioning, such as segment repetitions, nested segment repetitions, delays or others. The number of repetitions and delay length may be predetermined or random, bound or unbound, or any combination thereof.

Yet another technical solution of the disclosure relates to describing the waveforms in a spreadsheet or a spreadsheet-lie interface, wherein each time slot of each signal may be represented as a cell in the spreadsheet. Such interface, which contains a table having values in cells and operations provides for easy editing of the signals, including entering values, copying/pasting one or more cells, referring to a cell when calculating another cell, or the like. Additionally, signals can be drawn by providing an option of using a pointing device such as a mouse, a touch screen, a joystick or the like, to draw horizontal lines in one or more cells, and thus visually enter a signal wave. Operations such as copying and pasting cells provide for visually introducing repetitions, delays, or the like. A scenario may thus be defined by entering data which may include wave patterns, and adding graphical elements to the spreadsheet, such as colors.

One technical effect of utilizing the disclosed subject matter is the provisioning of a combined tool for design-level verification, which may serve for simulation as well as for formal analysis. This combination may provide flexibility, high speed and capacity of simulation techniques, with the power of formal analysis to locate bugs and enable deeper design exploration, thus providing a single front-end allowing seamless bridging between simulation techniques and formal analysis, and a single stop for designer-level verification, which may be combined with the development environment in which the designer is normally working.

Another technical effect of utilizing the disclosed subject matter is the easy description of waveforms using a graphical language. The graphical language allows introducing repetitions, nested repetitions, delays or other constructs.

Yet another technical effect of utilizing the disclosed subject matter is the usage of a spreadsheet for describing a waveform, which lends itself easily to the graphical language and provides for easy introduction of waveforms.

Yet another technical effect of utilizing the disclosed subject matter is the provisioning of a single graphical language useful for defining both coverage goals and correctness checkers for a design.

It will be appreciated that signals in a spreadsheet having visually similar manner, for example differ only in color or pattern, may receive different meaning or interpretation, and may affect the selected engine or its mode of operation. For example, the same signal entered in different colors may imply whether the signal represents an expected result, a constraint, a coverage goal or the like.

Referring now to FIG. 1, showing an exemplary user interface of an apparatus for design-level verification, in accordance with some exemplary embodiments of the disclosed subject matter.

User interface 100 comprises an input area 104 for the user to introduce scenarios, for example as waveforms. As an example, the user may have introduced a clock signal referenced ARB_CLOCK 108 which switches between two levels, a CMD signal 112 which assumes 1-bit predetermined values at predetermined time slots, and REQ signal 116 which assumes 3-bit predetermined values at predetermined time slots. The input signals are editable by the user as detailed in association with FIGS. 2, 3 and 4 below.

It will be appreciated that empty cells and undefined input values may be assigned a default value, which may be based on a parameter such as a noise level parameter defined by the user. This parameter may determine whether undefined values receive random values (indicating a noisy environment), take a specific value (indicating a quiet-low environment) or maintain the last specified value (indicating a quiet-stable environment).

User interface 100 may further comprise result area 120, showing the output signals. The value of the output signals may be provided based on simulation, formal analysis, or the like. Result area 120 may or may not display the input signals as well, in accordance with the user's selection.

As an example, result area 120 shows ARB_CLOCK signal 124, CMD signal 128 and REQ signal 132. Although signals 124, 128 and 132 are as defined in input window 104, they may be displayed in a different visual manner then in input areas 104.

Result area 120 further displays GNT signal 136 which is the output signal.

The four signals are displayed on a common timeline, which potentially makes it relatively easy to examine the output vs. the input. If the user notices a problem or mistakes in any of the input signals, he or she can immediately change the relevant signal in input area 104, and observe the updated results in result window 120.

It can be seen that signals 124, 128 and 132 correspond to the user defined signals 108, 112 and 116, respectively.

In some embodiments, input window 104 may be implemented as a spreadsheet. By defining a number of macros, for example macros associated with repetitions or delays, this implementation may potentially provide for easy and powerful editing of the input signals, as detailed below.

It will be appreciated that a user may also provide expected results in input window 100. The simulation results may then be displayed in result area 120 along with the expected results. If the actual result does not match the expected result, a mismatch notification may be displayed, optionally indicating the first mismatch.

In some embodiments, similarly to driving input signals, the user may specify a signal that will override the existing signal logic.

In some embodiments, In addition to driving and overriding signals, a scenario provided by a user may also define constraints over internal signals or outputs and not only over external ones. An engine, such as a simulation engine or a formal analysis engine, may then be applied to detect input patterns that satisfy the constraints or report the absence of such patterns.

Figure 2:
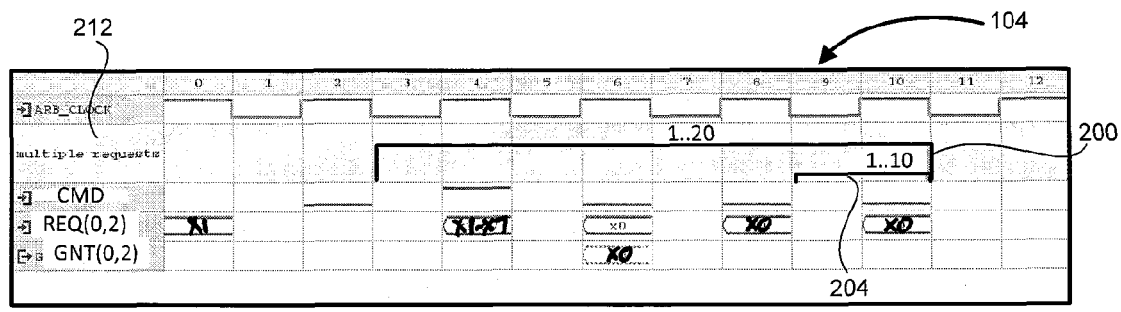
FIG. 2 shows an exemplary user interface for introducing signal repetitions, in accordance with some exemplary embodiments of the disclosed subject matter.
Figure 3:
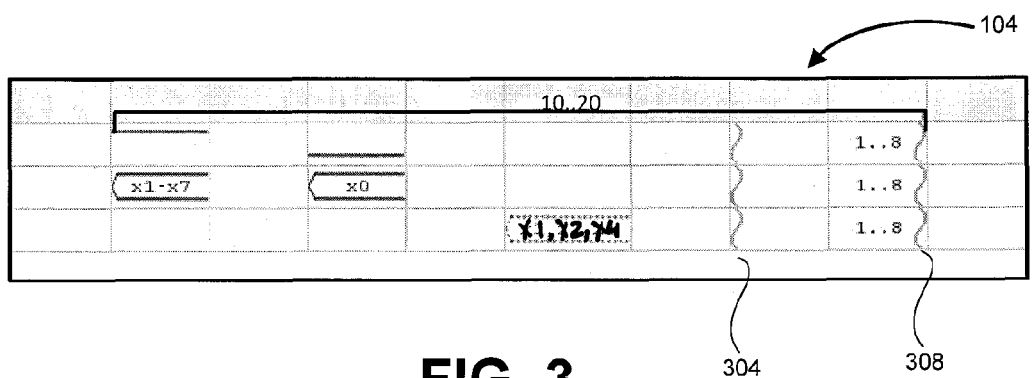
FIG. 3 shows an exemplary user interface for introducing signal delays, in accordance with some exemplary embodiments of the disclosed subject matter.
Figure 4:
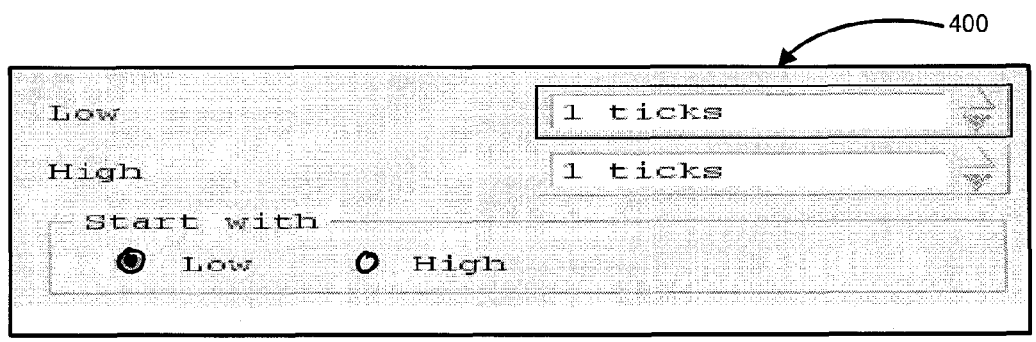
FIG. 4, shows an exemplary user interface for defining a macro for a signal, in accordance with some exemplary embodiments of the disclosed subject matter.

Referring now to FIGS. 2, 3 and 4, demonstrating exemplary features of a language for defining signals. The features are easily implementable using spreadsheet features and macros.

Referring now to FIG. 2, showing an exemplary user interface for introducing signal repetitions, in accordance with some exemplary embodiments of the disclosed subject matter.

FIG. 2 shows input area 104 as in FIG. 1, with additional indications for repetitions of parts of one or more of the input signals. Thus, input area 104 comprises a first repetition indication 200, indicating 20 repetitions of time slots 3-10, and a second repetition 204 indicating 10 repetitions of time slots 9 and 10 within each repetition of time slots 3-10.

It will be appreciated that the indicated repetitions may not apply to the clock signal. In this example since indications 200 and 204 refer to an even number of slots, the repetitions may have also been applied to the clock signal, and this is left to the user's discretion.

FIG. 2 also indicates that at time slot 4, REQ signal may assume any 3-bit value between 1 and 7. FIG. 2 further indicates an expected value for GNT signal at time slot 6, being 0. The value being an expected value may be indicated by the dashed lines, different color, or in any other visual manner.

FIG. 2 also indicates "Multiple Requests" 212 which refers to input CMS signal, input REQ signal and output GNT signal appearing below "Multiple Requests" 212, which are therefore required to be synchronized.

Referring now to FIG. 3, showing an exemplary user interface for introducing signal delays, in accordance with some exemplary embodiments of the disclosed subject matter.

FIG. 3 shows a part of input area 104, with a start delay indication 304 and stop delay indication 308, together indicating a random delay of between 1 and 8 clock ticks over two time slots, providing a total delay of 2 to 16 time slots, within each of the last 10 repetitions of time slots 3-10 discussed above.

It will be appreciated that the delay may be of fixed or varying length, wherein varying length may be predetermined or random. In the case of varying length, one waveform may actually represent a group of multiple specifications, when an event may be triggered at various points on the timescale.

Input area 104 of FIG. 3 also indicates an expected value of 1, 2, or 4 for the GNT signal at time slot 8.

Referring now to FIG. 4, showing an exemplary user interface for defining a macro, in accordance with some exemplary embodiments of the disclosed subject matter.

Macros may be used for defining a parameterized pattern, which allows for easier specification. Some common macros may refer to clock, reset, constant, random or one-hot signals. Once a macro is defined, it may be used for defining a multiplicity of signals, which may behave, at least in parts thereof, in accordance with the macro.

FIG. 4 shows area or window 400 in which a user can define a signal such as a clock signal. The user may define the number of high ticks, the number of low ticks and whether the signal starts with a low or a high value. It will be appreciated that further options may be provided. For example if the high (or low) value is of multiple ticks and the signal starts with high value, then the user may define which of the multiple ticks the signal is to start with.

It will be appreciated that the options demonstrated in FIGS. 2, 3 and 4 are exemplary only, and that other manipulations may be applied to signals. Introducing the manipulations may be done in an easy and intuitive manner using predetermined or user-provided options and macros. Additionally or alternatively, a spreadsheet may be used to provide the definitions.

Figure 5:
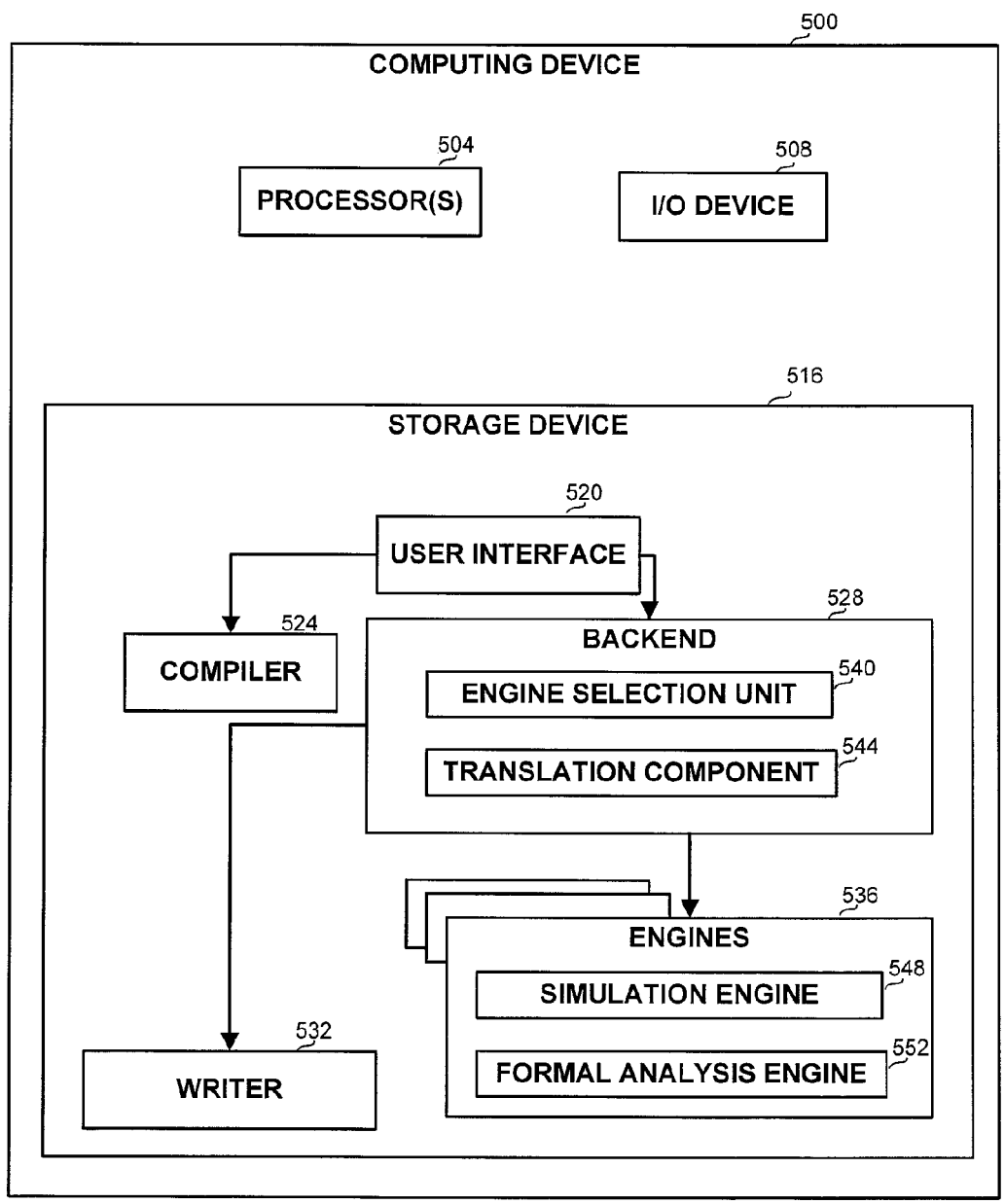
FIG. 5 shows a block diagram of components of an apparatus for design verification, in accordance with some exemplary embodiments of the disclosed subject matter.

Referring now to FIG. 5, showing a block diagram of components of an apparatus for design verification, in accordance with some exemplary embodiments of the disclosed subject matter.

The apparatus may comprise a computing platform 500. Computing platform 500 may comprise a processor 504. Processor 504 may be a Central Processing Unit (CPU), a microprocessor, an electronic circuit, an Integrated Circuit (IC) or the like. Alternatively, computing platform 500 can be implemented as firmware written for or ported to a specific processor such as digital signal processor (DSP) or microcontrollers, or can be implemented as hardware or configurable hardware such as field programmable gate array (FPGA) or application specific integrated circuit (ASIC). Processor 504 may be utilized to perform computations required by computing platform 500 or any of it subcomponents.

In some embodiments, computing platform 500 may comprise an input-output (I/O) device 508 such as a terminal, a display, a keyboard, an input device or the like, used to interact with the system, to invoke the system and to receive results. It will however be appreciated that the system can operate without human operation.

In some exemplary embodiments, computing platform 500 may comprise one or more storage devices such as storage device 516. Storage device 516 may be persistent or volatile. For example, storage device 516 can be a Flash disk, a Random Access Memory (RAM), a memory chip, an optical storage device such as a CD, a DVD, or a laser disk; a magnetic storage device such as a tape, a hard disk, storage area network (SAN), a network attached storage (NAS), or others; a semiconductor storage device such as Flash device, memory stick, or the like. In some exemplary embodiments, storage device 516 may retain program code operative to cause processor 504 to perform acts associated with the disclosure.

The components detailed below may be implemented as one or more sets of interrelated computer instructions, executed for example by processor 504 or by another processor. The components may be arranged as one or more executable files, dynamic libraries, static libraries, methods, functions, services, or the like, programmed in any programming language and under any computing environment.

Storage device 516 may comprise a user interface component 520 for interacting with the user, including receiving input, such as the signal or scenario specification, and displaying output such as simulation results including the output signals. User interface component 520 may also enable project setup and management of multiple scenarios. User interface component 520 may provide for inputting one or more input signals, and may comprise tools for manipulating the signals, for example by repeating parts thereof including nested repetitions for a predetermined or random number of times, delaying parts of a signal for a predetermined or random length of time, or the like.

User interface component 520 may interact with compiler 524 for launching compilation or re-compilation of the user's code. Compiling may comprise parsing the designed block, and generating a hardware model, for example in a netlist representation.

User interface component 520 may also interact with back-end unit 528, which may be responsible for simulating scenarios input by the user. Backend unit 528 may interact with writer 532 responsible for generating a driver based on the input scenarios. Writer 532 may translate the input and assertions from the graphic language into actual signals to be generated, and to relevant checkers. The writer may store the driver in a file, for example in VHDL format.

Figure 6:
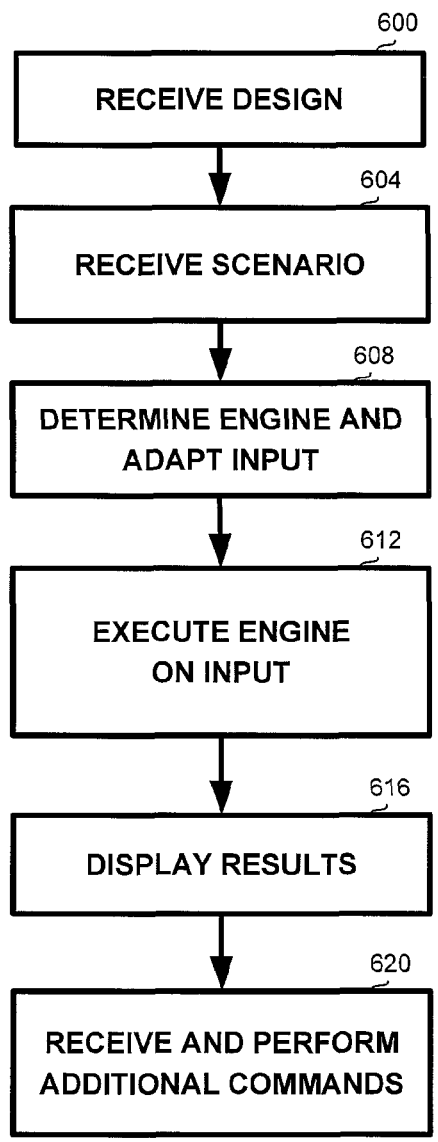
FIG. 6 shows a flowchart of steps for verifying a design, in accordance with some exemplary embodiments of the disclosed subject matter.

Backend unit 528 may then launch an engine 536. It will be appreciated that storage device 516 may comprise a multiplicity of engines. Backend unit 528 may further comprise engine selection unit 540 for automatically determining which of the engines is to be launched, such that the relevant engine may be launched for each scenario. The selection may be performed in view of the different properties of the design and requirements provided by the user. As an example, the selection may be based on factors such as model size, the specified scenario using internal signals or output constraints, coverage goals, correctness checkers, or the like. Backend unit 528 may also comprise a translation component 544 for adapting the input to the appropriate format of the relevant engine. Any of engines 536 may comprise one or more simulation engines 548 that provide dynamic simulation, or one or more formal analysis engines 552, including symbolic model checkers, explicit model checkers, SAT-based model checkers, theorem provers, bounded model checkers, or the like. The generated results may be displayed by user interface component 520. In some exemplary embodiments, in case a formal analysis engine is selected the checker and/or coverage goals may be translated into format suitable for the formal analysis engine such as, for example, exploration goals or correctness properties Referring now to FIG. 6, showing a flowchart of steps in designer level verification, in accordance with some exemplary embodiments of the disclosed subject matter.

On step 600, a design to be verified may be received from the user. In some exemplary embodiments, a selection may be received from a user, indicating a block to be verified within the design. The design or block thereof may then be loaded and compiled, if not compiled earlier. A "design" in the present disclosure may refer to any functional description of a circuit, including but not limited to a block of a hardware system.

On step 604, a scenario to be verified may be received from the user. The scenario may be received in one or more variations. A first variation relates to providing a concrete behavior, e.g., a single value (potentially including "don't care" values) for each signal at each time slot. A second variation may refer to specifying and reusing predetermined patterns, such as clocks, counters, shifters, or the like, as part of more complex scenarios. Another variation may relate to adding randomness, for example random values, random delays, or the like. Yet another variation may refer to specifying additional restrictions, which may be local or end-to-end restrictions. Another variation may refer to additional checks such as in-model assertions, external check, validity-related properties, coverage events or others.

On step 608, the relevant engine may be automatically determined for testing the scenario, and the input may be adapted for the specific engine. In some exemplary embodiments, engine selection may be based on scenario properties and constructs, such as number of simulation cycles, existence of constraints on outputs or internal signals, existence of expected results, or the like, as well as size of the design. For example, the existence of constraints requires formal engine. If no constraints or expected results are provided, then a simulation engine will be selected. If expected results are indicated but no randomness, then simulation may suffice, otherwise for a small design and a small number of simulation cycles, formal engine may be selected to attempt to violate the expected results.

In additional examples, certain formal engines may be useful only for models up to a certain size. Additionally or alternatively, the use of certain macros may indicate a preferred engine, such as a SAT based model. Additionally or alternatively, long scenarios which include relatively a large number of cycles may tend to be more suitable to simulation engines than formal analysis engines.

As an example, having a design with 321 flip flops, a scenario with 18 signals and of length 12 to be simulated for 150 cycles, a simulation engine may be selected, whereas the same design having a scenario with 11 signals and of length 6 to be simulated for 50 cycles, may be verified using a formal analysis engine.

In some exemplary embodiments, a checker, such as generated by writer 532, may be translated into a correctness property to be used by a formal analysis engine. Additionally or alternatively, the correctness property may be created based on the user input itself. In some exemplary embodiments, a coverage goal may be translated into exploration goals.

Some additional exemplary interpretations of user indications, wherein the interpretation may guide in the engine selection may are detailed below. It will be appreciated that although the user input may look visually similar in all cases, the selected engine or the implied test/action changes according to the interpretation. For example:

If a user indicates in a scenario that in cycle 15 the expected value of signal x is 3, an assertion may then be generated in the code stating that if cycle=15 then signal x=3.

If the user defines a constraint (for example in cycle 15 the value of signal x is 3) then a constraint is generated such that only cases in which signal x received value 3 in cycle 15 are considered. Such structure may be handled by a formal verification tool, which means that such tool will be invoked rather than a simulation tool.

The same scenario may be tested as a coverage goal, such that if the signal received that value it is added to a trace that assesses coverage, In yet another example the value may be used as overwrite: regardless of the value the signal assumed at cycle 15, the value of 3 overwrites it.

On step 612 the one or more selected engines may be executed on the input. The engine may test the functionality of the block. The engine may check the required conditions, such as the assertions or coverage goals, activate checks performed by external checkers, or the like. In some exemplary embodiments, the engine may test the functionality for all cycles, which may be the case with unbounded model checking. Additionally or alternatively, the engine may test the functionality for a bounded number of cycles, such as in bounded model checking and in simulation.

On step 616, the results, including the output waveforms, external check results and possibly additional information items are displayed to a user. The output may be displayed in another area of the same user interface as used by the user for introducing the input.

On step 620, one or more additional activities may be performed upon commands received from the user, such as extending the simulation length, re-simulating, possibly with a new seed for the random values, refining the scenario specification, or modifying of the design, possibly followed by compilation and re-simulation.

Experimental Results

An apparatus and method in accordance with the disclosure were used for implementing a 16 row Least Recently Used (LRU) table with four write ports, simulating various scenarios that verify and explore design behaviors.

Figure 7:
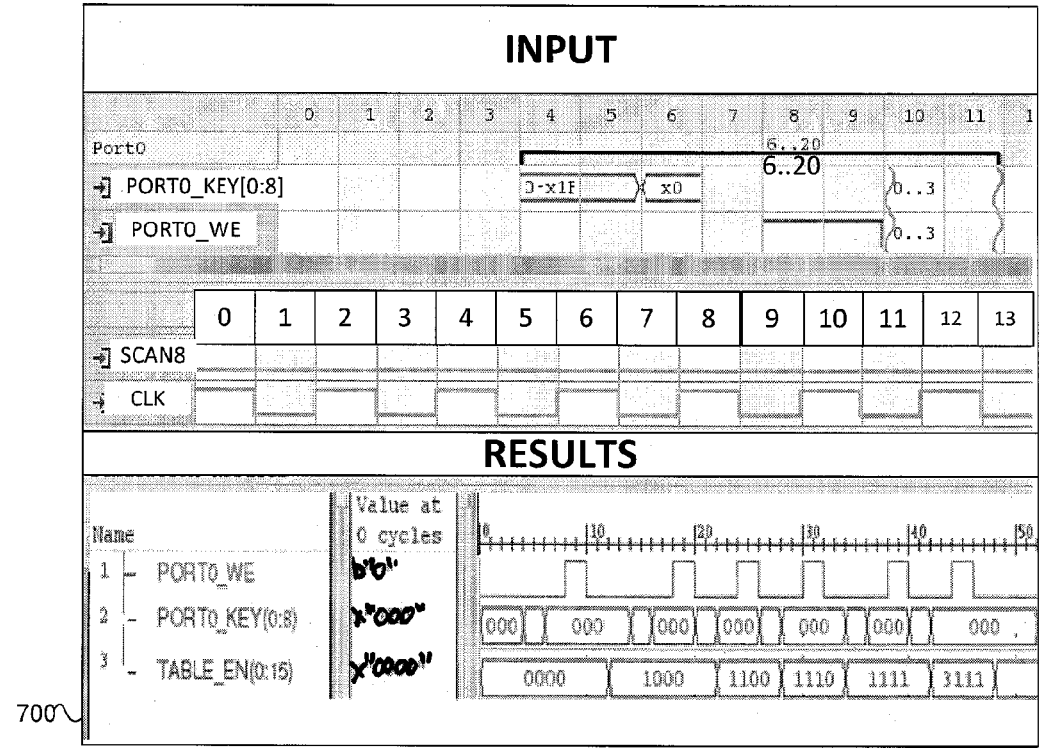
FIGS. 7-10 show exemplary scenarios of editing and output displays, in accordance with some exemplary embodiments of the disclosed subject matter.

In a first scenario, demonstrated in FIG. 7, it is required to verify that writes to port 0 alone are reflected in the LRU table. First, an initialization scenario may be created: the clock is defined and non-functional logic may be set to zero. A synchronized group may then be created, named for example Port0, and consisting of the enable signal PORT0_WE and the data bus PORT0_KEY. Data may be randomized in the range of 0-0x1F1, and the enable signal is set to be asserted two cycles after data is ready, as the protocol defines. It is required to examine 6 to 20 such write transactions, spaced with a random delay of 0-3 cycles. The noise level may be set to quiet-low and simulation may be launched. The results pane may display that table_en 700 gets filled with 1's as entries are added, which corresponds to the expected behavior.

Figure 8:
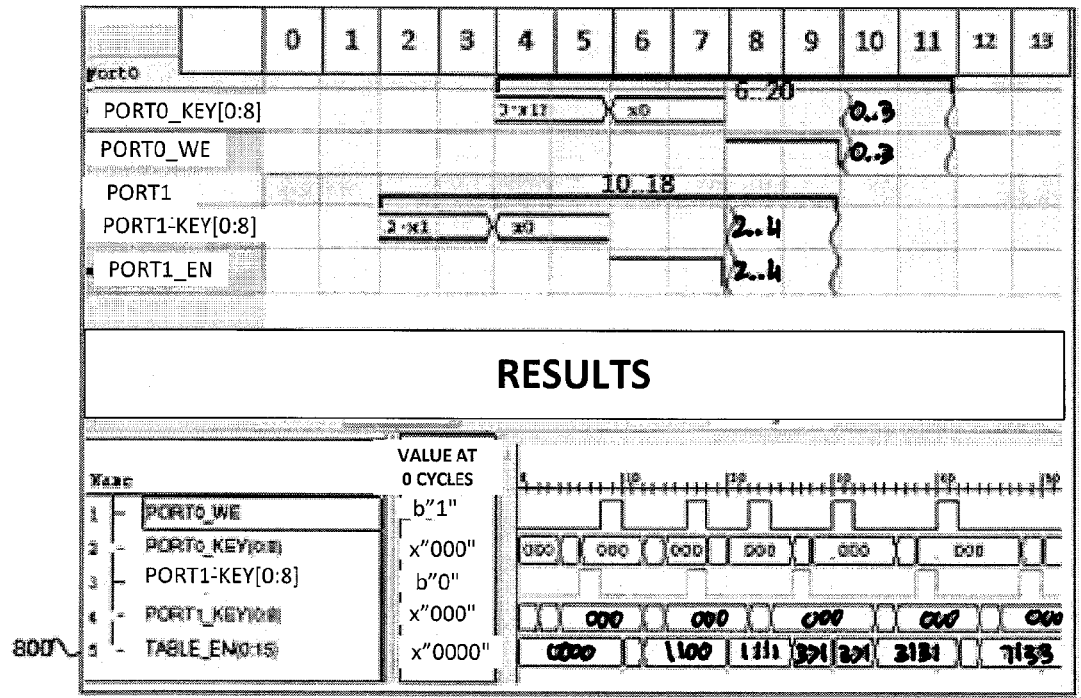

In a second scenario demonstrated in FIG. 8, it is required to enable port 1 writes as well. To that end, another independent synchronized group is defined, named Port1. Similarly to Port0, Port1 has two cycles between the cycle in which the key is read and the cycle in which it is enabled. Unlike Port0, longer delays are enabled in Port1 and it is let to write 10 to 18 times. As before, the noise level may be set to quiet-low. Simulation may then be launched. The results pane may display that table_en 800 is now filled faster than in the previous scenario, since this is an LRU table which now receives entries from two ports and not just one as in the previous case.

Figure 9:
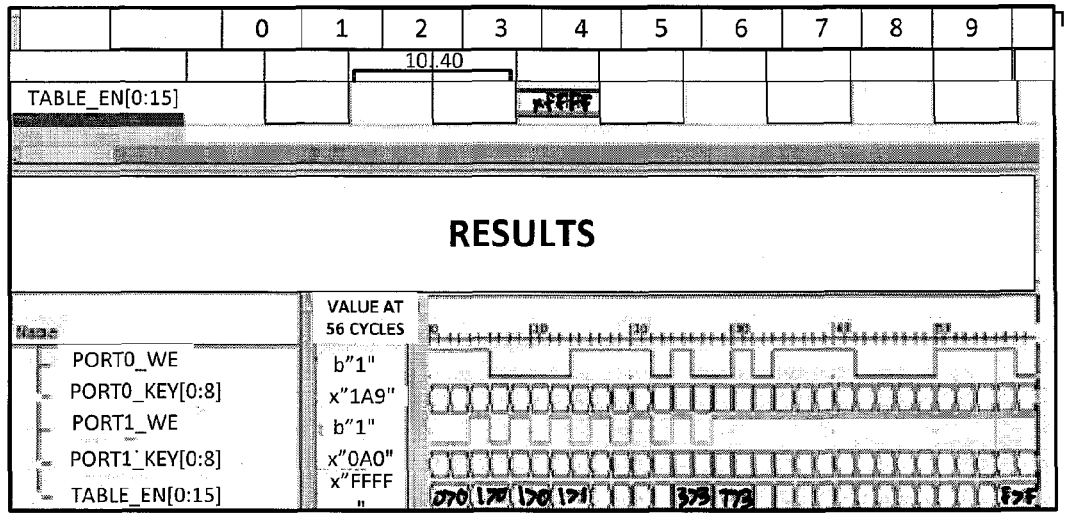

A third scenario depicted in FIG. 9 relates to verifying that the table can become full. A constraint may be added to the basic initialization scenario, in which after 10 to 40 cycles, the table is full as indicated in table_en assuming a value of 0xFFFF. The noise level may be set to noisy, and simulation may be launched. The constraint can indeed be met, possibly in extreme and non-standard write activity, at cycle 56.

Figure 10:
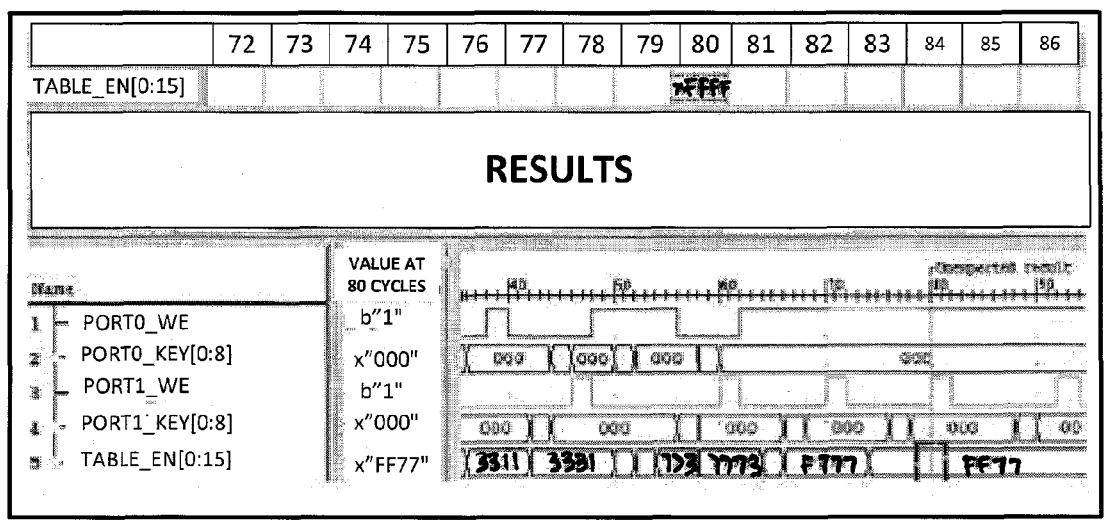

A fourth scenario depicted in FIG. 10 relates to checking whether the table, in a standard activity mode, is always full after, a predetermined number of cycles, for example 40 cycles. In order to check this, an expected result may be added to the second scenario. The results indicate an unexpected result, being that table_en is not full at tick 80.

The disclosed apparatus may provide a single front-end allowing for seamless bridging between simulation techniques and formal analysis, to enable a designer to perform initial verification of a designed block prior to integration.

The apparatus may provide for easy project setup by specifying a top-level HDL file, and displaying a single window enabling the full cycle of scenario-specification, simulation and result-analysis, by integrating with compilers, simulation engines and wave viewers.

The apparatus may support specification of scenario requirements and expected simulation results as a waveform.

The flowchart and block diagrams in the figures illustrate the architecture, functionality, and operation of possible implementations of systems, methods and computer program products according to various embodiments of the present disclosure. In this regard, each block in the flowchart and some of the blocks in the block diagrams may represent a module, segment, or portion of program code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As will be appreciated by one skilled in the art, the disclosed subject matter may be embodied as a system, method or computer program product. Accordingly, the disclosed subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, any non-transitory computer-readable medium, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, and the like.

Computer program code for carrying out operations of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A computer-implemented method performed by a computerized device, comprising:
   receiving a design;
   receiving a description of a scenario, wherein the scenario relates to execution of the design, wherein the scenario is used for verifying the design;
   selecting whether a verification engine to be used is a simulation engine or a formal analysis engine;
   translating the scenario to an input for the verification engine as selected;
   activating the verification engine as selected, and providing the input to the verification engine, whereby the verification engine outputting a result; and
   displaying the result.

2. The method of claim 1, wherein said receiving the description of the scenario and said displaying the results utilize a single user interface having at least an input area and an output area.

3. The method of claim 1, wherein the scenario comprises values of an input signal at different cycles.

4. The method of claim 1 wherein the scenario is entered using a spreadsheet-like interface.

5. The method of claim 4 wherein a signal is described by drawing horizontal lines in one or more cells in a spreadsheet using a pointing device.

6. The method of claim 5, wherein the spreadsheet-like interface provides for adding at least one graphical element to the wave form signal description.

7. The method of claim 5 wherein a value in the spreadsheet is interpreted in at least two manners based upon the at least one graphical element.

8. The method of claim 4 wherein the spreadsheet-like interface provides an element representing repeating a part of the signal multiple times.

9. The method of claim 4 wherein the spreadsheet-like interface provides an element representing delaying a part of the signal for one or more cycles.

10. The method of claim 4 wherein the spreadsheet-like interface provides for using a macro for entering a scenario.

11. The method of claim 1 wherein the scenario is defined based on two or more signals, wherein the scenario defines that the two or more signals are synchronized.

12. The method of claim 1, wherein a feature of the scenario is automatically translated into a coverage goal for the simulation engine and into an exploration goal for the formal analysis engine.

13. The method of claim 1, wherein correctness checker is generated for checking an expected result of the scenario.

14. A computerized apparatus having a processor, the processor being adapted to perform the steps of:
   receiving a design;
   receiving a description of a scenario, wherein the scenario relates to execution of the design, wherein the scenario is used for verifying the design;
   selecting whether a verification engine to be used is a simulation engine or a formal analysis engine;
   translating the scenario to an input for the verification engine as selected;
   activating the verification engine and providing the input to the verification engine, whereby the verification engine outputting a result; and
   displaying the result.

15. The computerized apparatus of claim 14, comprising a spreadsheet-like interface for entering input comprising a signal, and receiving output.

16. The computerized apparatus of claim 15 wherein the signal is entered as horizontal lines in one or more cells in a spreadsheet.

17. The computerized apparatus of claim 15 wherein the spreadsheet-like interface provides for using a macro for entering a scenario.

18. A computer program product comprising a non-transitory computer readable storage medium retaining program instructions, which program instructions when read by a processor, cause the processor to perform a method comprising:

receiving a design;
receiving a description of a scenario, wherein the scenario relates to execution of the design, wherein the scenario is used for verifying the design;
selecting whether a verification engine to be used is a simulation engine or a formal analysis engine;
translating the scenario to an input for the verification engine as selected;
activating the verification engine and providing the input to the verification engine, whereby the verification engine outputting a result; and
displaying the result.

* * * * *